(12) United States Patent
Chen et al.

(10) Patent No.: US 9,165,834 B2
(45) Date of Patent: Oct. 20, 2015

(54) INTEGRATED NATIVE DEVICE WITHOUT A HALO IMPLANTED CHANNEL REGION AND METHOD FOR ITS FABRICATION

(75) Inventors: Xiangdong Chen, Irvine, CA (US); Akira Ito, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 733 days.

(21) Appl. No.: 12/660,618

(22) Filed: Mar. 1, 2010

(65) Prior Publication Data
US 2011/0210388 A1    Sep. 1, 2011

(51) Int. Cl.
*H01L 29/66* (2006.01)
*H01L 21/8234* (2006.01)
*H01L 21/265* (2006.01)
*H01L 29/10* (2006.01)

(52) U.S. Cl.
CPC .. *H01L 21/823412* (2013.01); *H01L 21/26586* (2013.01); *H01L 29/1083* (2013.01)

(58) Field of Classification Search
USPC .......................... 257/327, E21.618; 438/527
See application file for complete search history.

(56) References Cited

U.S. PATENT DOCUMENTS

| | | | |
|---|---|---|---|
| 6,417,550 B1* | 7/2002 | Madurawe et al. | 257/408 |
| 6,909,639 B2* | 6/2005 | Park et al. | 365/185.25 |
| 2004/0185595 A1* | 9/2004 | Lee | 438/57 |
| 2005/0233494 A1* | 10/2005 | Hong | 438/57 |
| 2006/0054965 A1* | 3/2006 | Kim et al. | 257/315 |
| 2009/0224290 A1* | 9/2009 | Miyashita | 257/272 |
| 2010/0244150 A1* | 9/2010 | Bahl et al. | 257/408 |

\* cited by examiner

*Primary Examiner* — Matthew Gordon
(74) *Attorney, Agent, or Firm* — Oblon, McClelland, Maier & Neustadt, L.L.P.

(57) ABSTRACT

According to one embodiment, a semiconductor structure including an integrated native device without a halo implanted channel region comprises an arrangement of semiconductor devices formed over a common substrate, the arrangement includes native devices disposed substantially perpendicular to non-native devices, wherein each of the native and non-native devices includes a respective channel region. The arrangement is configured to prevent formation of halo implants in the native device channel regions during halo implantation of the non-native device channel regions. In one embodiment, the disclosed native devices comprise native transistors capable of avoiding threshold voltage roll-up for channel lengths less than approximately 0.5 um.

16 Claims, 6 Drawing Sheets

US 9,165,834 B2

INTEGRATED NATIVE DEVICE WITHOUT A HALO IMPLANTED CHANNEL REGION AND METHOD FOR ITS FABRICATION

BACKGROUND OF THE INVENTION

1. Field of the Invention

The present invention generally relates to the field of semiconductors. More particularly, the invention relates to the fabrication of native semiconductor devices.

2. Background Art

A native semiconductor device, or simply "native device," is a transistor ideally having a threshold voltage near zero volts. It can be desirable to provide native semiconductor devices along with non-native semiconductor devices. A non-native device can include halo implants in a channel region of the device. As channel lengths become smaller, the halo implants in the non-native device become more crucial, for example, to reduce short channel effects. A conventional native device can also include halo implants in a channel region of the device. At large channel lengths, halo implants can have little impact on the threshold voltage of the native device. However, as channel lengths become smaller, halo implants can undesirably cause roll-up of threshold voltage in the native device.

It is also desirable to integrate manufacturing processes of native and non-native devices. Conventional manufacturing processes can provide for native devices formed along with non-native devices, where both native and non-native devices include halo implanted channel regions. It is very desirable to provide native devices without halo implanted channel regions to prevent threshold voltage roll-up as channel lengths become smaller. However, the constraint that halo implants not be formed in native devices can adversely affect integration of manufacturing processes for native and non-native devices, for example, by requiring additional process steps and thereby increasing manufacturing cost and time.

Thus, there is a need in the art for a solution enabling integrated fabrication of native devices and non-native devices for short channel lengths.

SUMMARY OF THE INVENTION

An integrated native device without a halo implanted channel region and method for its fabrication, substantially as shown in and/or described in connection with at least one of the figures, as set forth more completely in the claims.

DETAILED DESCRIPTION OF THE INVENTION

The present invention is directed to an integrated native device without a halo implanted channel region and method for its fabrication. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
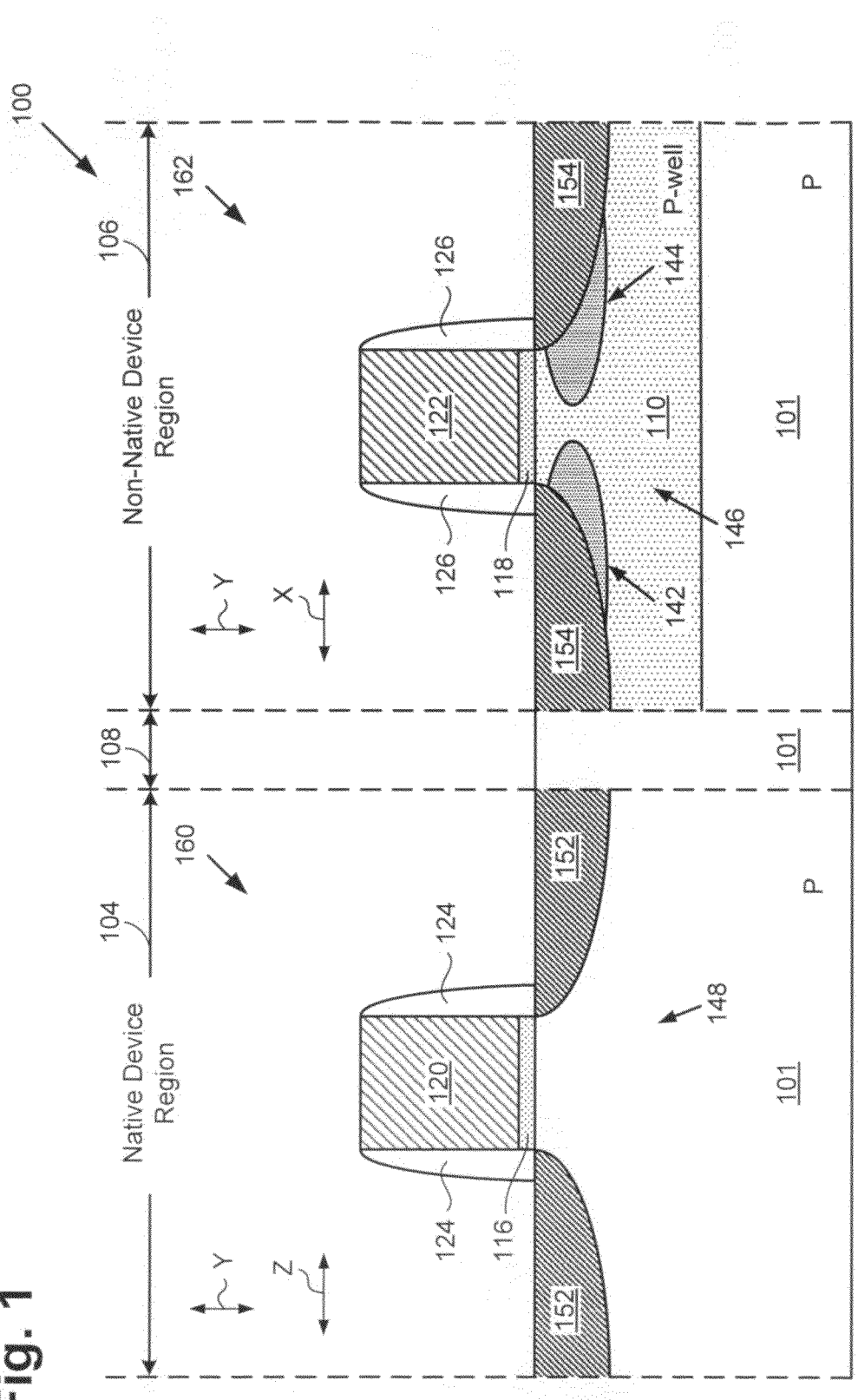
FIG. 1 shows a cross-sectional view of exemplary integrated native and non-native devices, in accordance with one embodiment of the present invention.

FIG. 1 shows a cross-sectional view of exemplary integrated native and non-native devices, in accordance with one embodiment of the present invention. In FIG. 1, structure 100 includes native device 160 integrated with non-native device 162. Native device 160, which can also be called native transistor 160, is situated in native device region 104 of structure 100 and can comprise a logic core transistor, for example. Native device 160 includes substrate 101, which comprises a semiconductor substrate, for example, a P-type semiconductor substrate. As shown in FIG. 1, channel region 148 of native device 160 is disposed in substrate 101 and has a channel length between source/drain regions 152. In one embodiment, source/drain regions 152 can comprise lightly doped drain-source (LDD) regions in substrate 101, and can have N-type conductivity.

Native device 160 also includes insulative region 116, conductive region 120, and sidewall spacers 124. Insulative region 116 is disposed over channel region 148 and conductive region 120 is disposed over insulative region 116. In native device 160, sidewall spacers 124 are disposed on respective sidewalls of conductive region 120.

Also in FIG. 1, non-native device 162, which can also be called non-native transistor 162, is situated in non-native device region 106 of structure 100, which is separated from native device region 104 by intervening region 108. Non-native device 162 is disposed perpendicular to (or substantially perpendicular to) native device 160 and includes substrate 101 and well region 110. In one embodiment, well region 110 can comprise a doped P-well formed in substrate 101. Furthermore, well region 110 can be more heavily doped than substrate 101. As shown in FIG. 1, channel region 146 of non-native device 162 is disposed in well region 110 and has a channel length between source/drain regions 154. In one embodiment, source/drain regions 154 can comprise LDD regions regions formed in well region 110, and can have N-type conductivity. Non-native device 162 also includes halo regions 142 and 144 formed in well region 110 and channel region 146, which can comprise doped P regions and can be more heavily doped than well region 110 and substrate 101.

Further shown in FIG. 1, non-native device 162 includes insulative region 118, conductive region 122, and sidewall spacers 126. Insulative region 118 is disposed over channel region 146 and conductive region 122 is disposed over insulative region 118. In non-native device 162, sidewall spacers 126 are disposed on respective sidewalls of conductive region 122.

It will be appreciated that structure 100 includes additional elements, for example, elements of native device 160 and non-native device 162, not shown in FIG. 1 for clarity. Furthermore, structure 100 can include a number of native devices 160 each formed perpendicular to (or substantially perpendicular to) a number of non-native devices 162. Other features and advantages of structure 100 will be set forth with reference to the method of FIG. 2 and related FIGS. 3A-3D.

Figure 2:
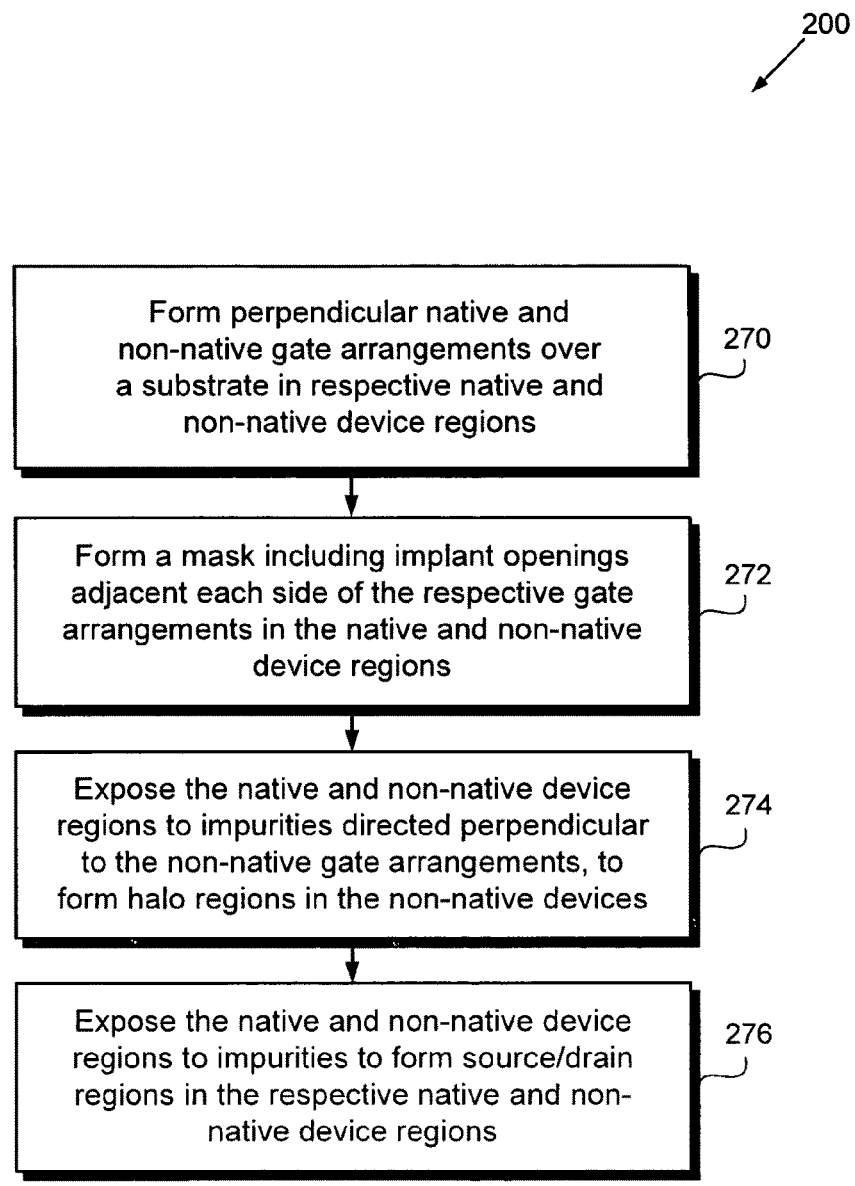
FIG. 2 shows a flowchart showing the steps taken to implement one embodiment of the present invention.

Referring to FIG. 2, FIG. 2 shows flowchart 200 describing a method for fabricating an integrated native device without a halo implanted channel region, according to one embodiment of the present invention. Certain details and features have been left out of flowchart 200 that are apparent to a person of ordinary skill in the art. For example, a step may consist of one or more substeps or may involve specialized equipment or materials, as known in the art. Steps 270 through 276 indicated in flowchart 200 are sufficient to describe one embodiment of the present invention, however, other embodiments of the invention may utilize steps different from those shown in flowchart 200. It is noted that the processing steps shown in flowchart 200 are performed on a portion of processed wafer, which, prior to step 270, includes, among other things, a substrate with native and non-native device regions, and a well region, such as a P-well region, in the non-native device region. The processed wafer may also be referred to simply as a wafer or a semiconductor die or simply a die in the present application.

Moreover, structures 370 through 376 in FIGS. 3A through 3D show the result of performing steps 270 through 276 of flowchart 200, respectively. For example, structure 370 shows a semiconductor structure after processing step 270, structure 372 shows structure 370 after the processing of step 272, structure 374 shows structure 372 after the processing of step 274, and so forth.

Figure 3A:
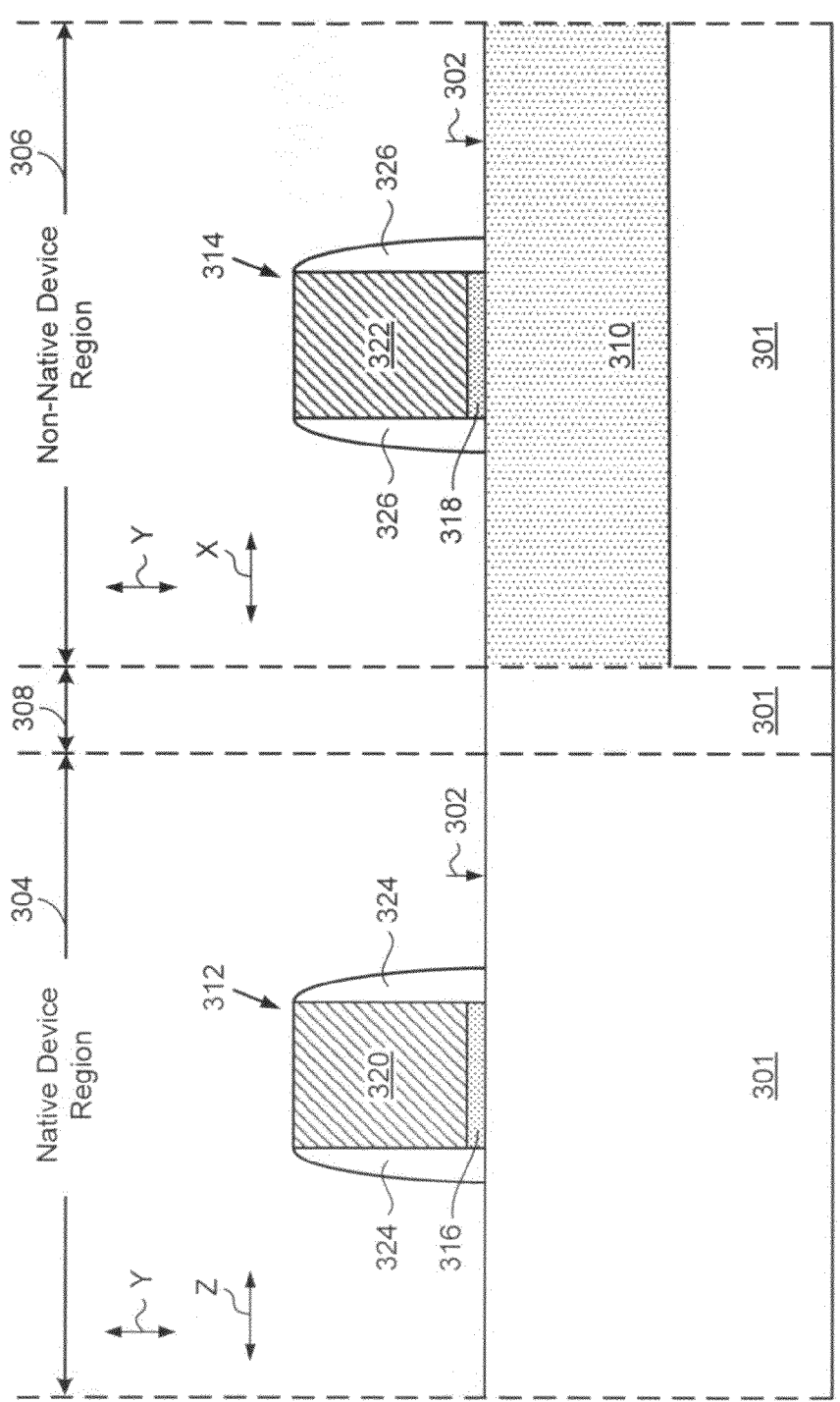
FIG. 3A shows a cross-sectional view, which includes a portion of a wafer processed according to an embodiment of the invention, corresponding to an initial step in the flowchart in FIG. 2.

Referring now to step 270 of FIG. 2 and FIG. 3A, step 270 of flowchart 200 comprises forming perpendicular native and non-native gate arrangements over a substrate in respective native and non-native device regions. Structure 370 of FIG. 3A shows a cross-sectional view of a structure including a substrate, after completion of step 270 of flowchart 200 in FIG. 2. In structure 370, the front side surface of the wafer is indicated by arrow 302. Structure 370 includes substrate 301, respective native and non-native device regions 304 and 306, intervening region 308, well region 310, insulative regions 316 and 318, conductive regions 320 and 322, and sidewall spacers 324 and 326, which correspond respectively to substrate 101, native and non-native device regions 104 and 106, intervening region 108, well region 110, insulative regions 116 and 118, conductive regions 120 and 122, and sidewall spacers 124 and 126, in FIG. 1.

Further shown in FIG. 3A, native and non-native device regions 304 and 306 include respective native and non-native gate arrangements 312 and 314. In structure 370, native and non-native gate arrangements 312 and 314 include respective insulative regions 316 and 318, conductive regions 320 and 322, and sidewall spacers 324 and 326.

In structure 370, native device arrangement 312 is formed perpendicular to non-native device region 314. That is, native device arrangement 312 can extend laterally along an X-axis and non-native gate arrangement 314 can extend laterally along a Z-axis perpendicular to the X-axis, where X and Z-axes correspond to respective X and Z-axes in a Cartesian coordinate system. FIG. 3A also shows a Y-axis, which corresponds to a Y-axis in a Cartesian coordinate system. The relative orientation of native device arrangement 312 and non-native device region 314 is further shown in FIG. 3B. For example, FIG. 3B shows line 3A-3A, which can correspond to a cross-sectional view of native and non-native device regions in structure 370 in FIG. 3A.

Figure 3B:
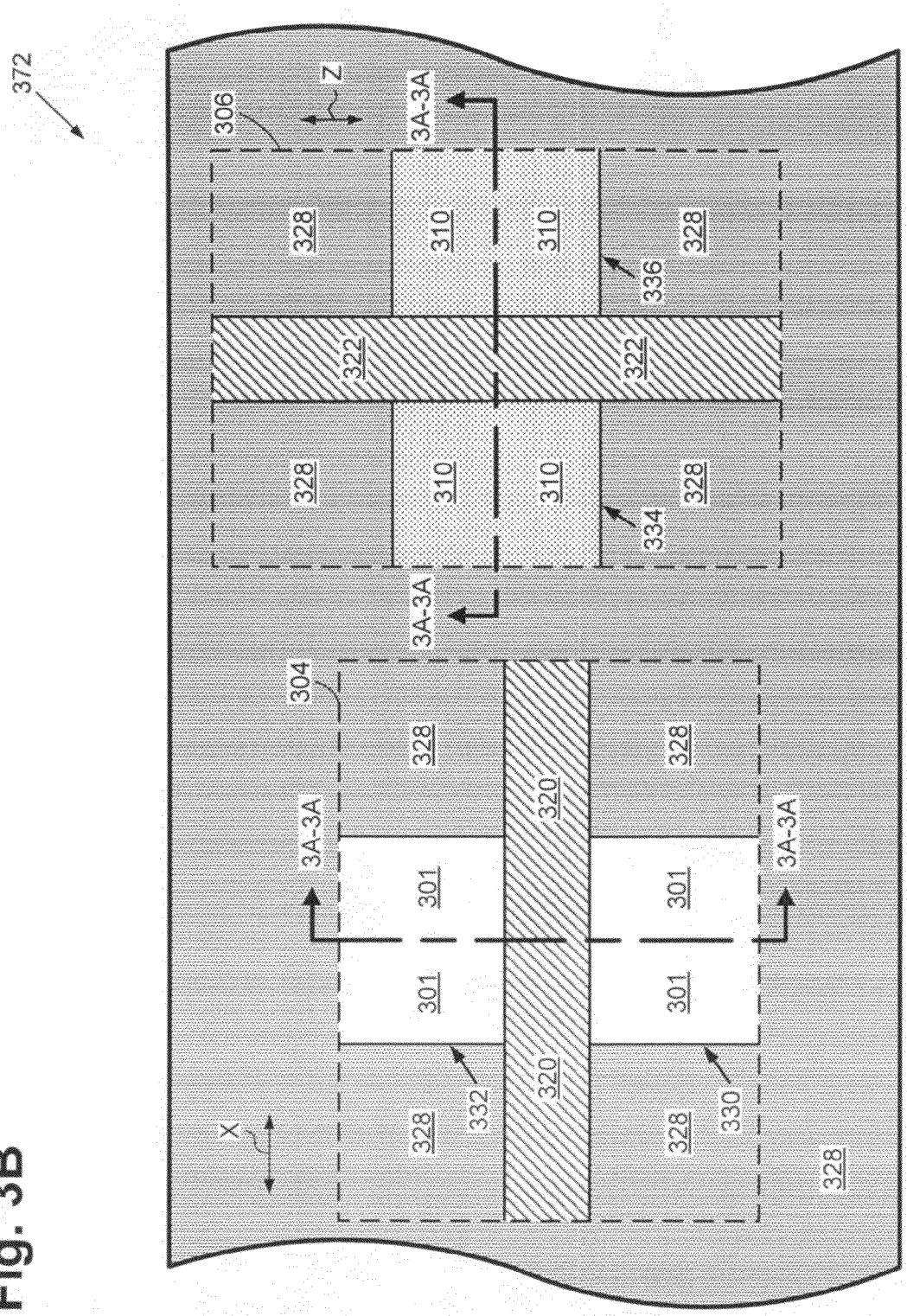
FIG. 3B shows a cross-sectional view, which includes a portion of a wafer processed according to an embodiment of the invention, corresponding to an intermediate step in the flowchart in FIG. 2.

Referring now to step 272 in FIG. 2 and structure 372 in FIG. 3B, at step 272 of flowchart 200, mask 328 is formed over front side surface 302. As shown in FIG. 3B, mask 328 is disposed in native and non-native device regions 304 and 306 and includes openings 330, 332, 334, and 336. In structure 372, openings 330 and 332 are disposed adjacent respective sides of conductive material 320 in native device region 304, and expose substrate 301. Also in structure 372, openings 334 and 336 are disposed adjacent respective sides of conductive material 322 in non-native device region 306, and expose well region 310. In one embodiment openings 330, 332, 334, and 336 can comprise openings for source/drain implants, which can form source/drain regions for native and non-native devices. Thus, mask 328 can comprise openings to form source/drain regions in both native and non-native device regions 304 and 306 in a shared implantation step. Openings 334 and 336 can also comprise openings for halo implants in non-native device region 306. Thus, in one embodiment, mask 328 can comprise openings to form both source/drain regions in native and non-native device regions 304 and 306 and halo regions in non-native device region 306. The result of step 272 of flowchart 200 is illustrated by structure 372 in FIG. 3B.

Figure 3C:
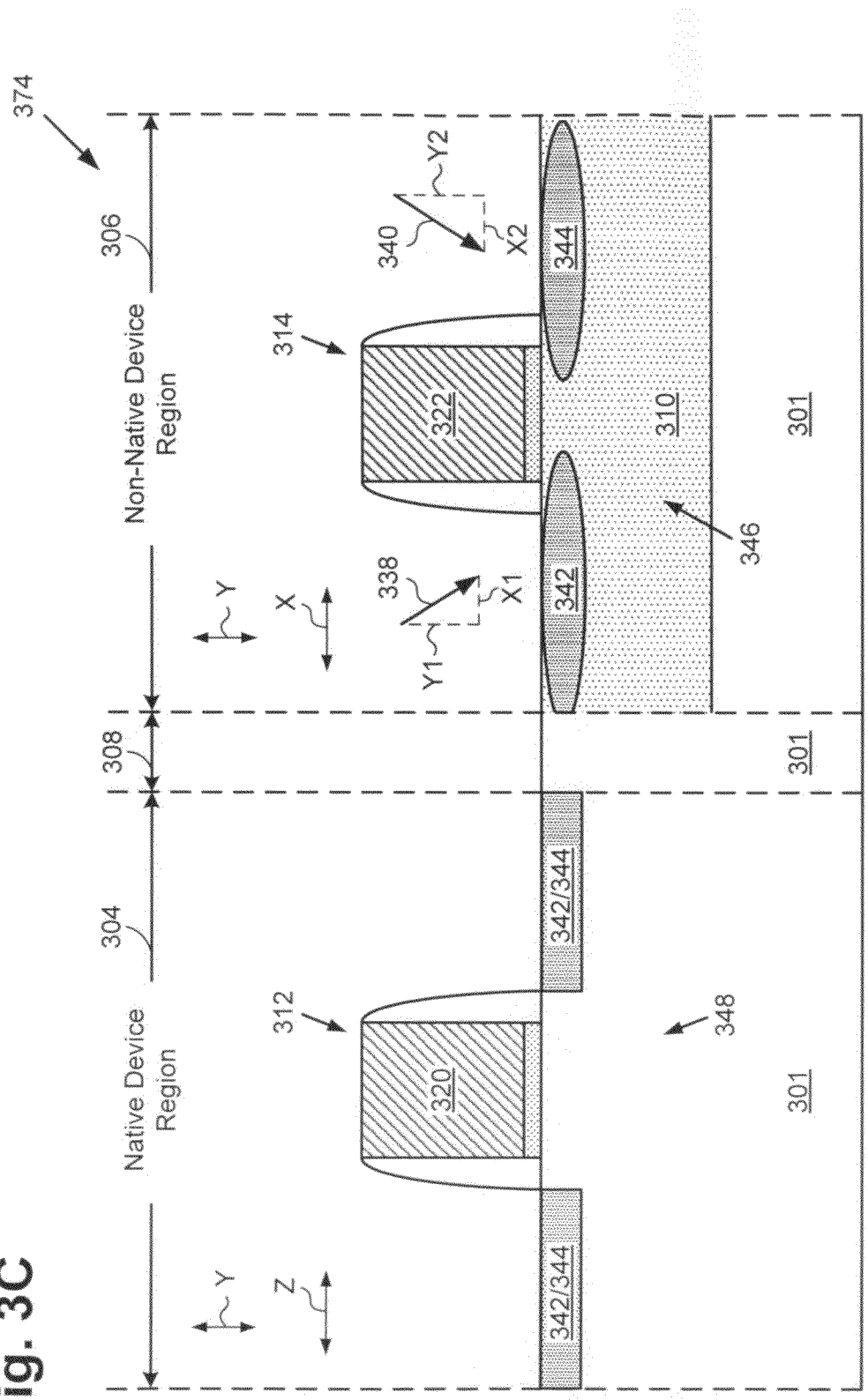
FIG. 3C shows a cross-sectional view, which includes a portion of a wafer processed according to an embodiment of the invention, corresponding to an intermediate step in the flowchart in FIG. 2.

Referring to step 274 in FIG. 2 and structure 374 in FIG. 3C, at step 274 of flowchart 200, native and non-native device regions 304 and 306 are exposed to impurities directed perpendicular to non-native gate arrangement 314 to form halo regions in non-native device region 306. For example, impurities can be directed along heading 338 through opening 334 and along heading 340 through opening 336 of mask 328 to form respective halo regions 342 and 344 in non-native device region 306, which can correspond to respective halo regions 142 and 144 in FIG. 1. As shown in FIG. 3C, heading 338 comprises component X1 along X-axis and component Y1 along Y-axis and heading 340 comprises component X2 along X-axis and component Y2 along Y-axis, such that, headings 338 and 340 are perpendicular to non-native gate arrangement 314. As such, halo regions 342 and 344 can be formed in well region 310 and in channel region 346 under non-native gate arrangement 314 in non-native device region 306. It is noted that channel region 346 under non-native gate arrangement 314 and channel region 348 under native device gate arrangement 312, in FIG. 3C, correspond respectively to channel regions 146 and 148, in FIG. 1.

As further shown in FIG. 3C, halo regions are notably not formed in channel region 348 under gate arrangement 312 in native device region 304. More particularly, impurities directed along headings 338 and 340 are blocked from channel region 348. For example, headings 338 and 340 are perpendicular to non-native gate arrangement 314, such that, native gate arrangement 312 can block impurities from channel region 348 under native gate arrangement 312. Consequently, despite implantation regions 342/344 being formed adjacent to native gate arrangement 312 as a result of halo implant formation in non-native device region 306, halo implantation under native gate arrangement 312 is avoided in native device region 304. Thus, in one embodiment, halo regions can be formed in non-native device region 306 through openings 334 and 336 of mask 328, while native device region 304 is substantially without halo regions under native arrangement 312. The result of step 274 of flowchart 200 is illustrated by structure 374 in FIG. 3C.

Figure 3D:
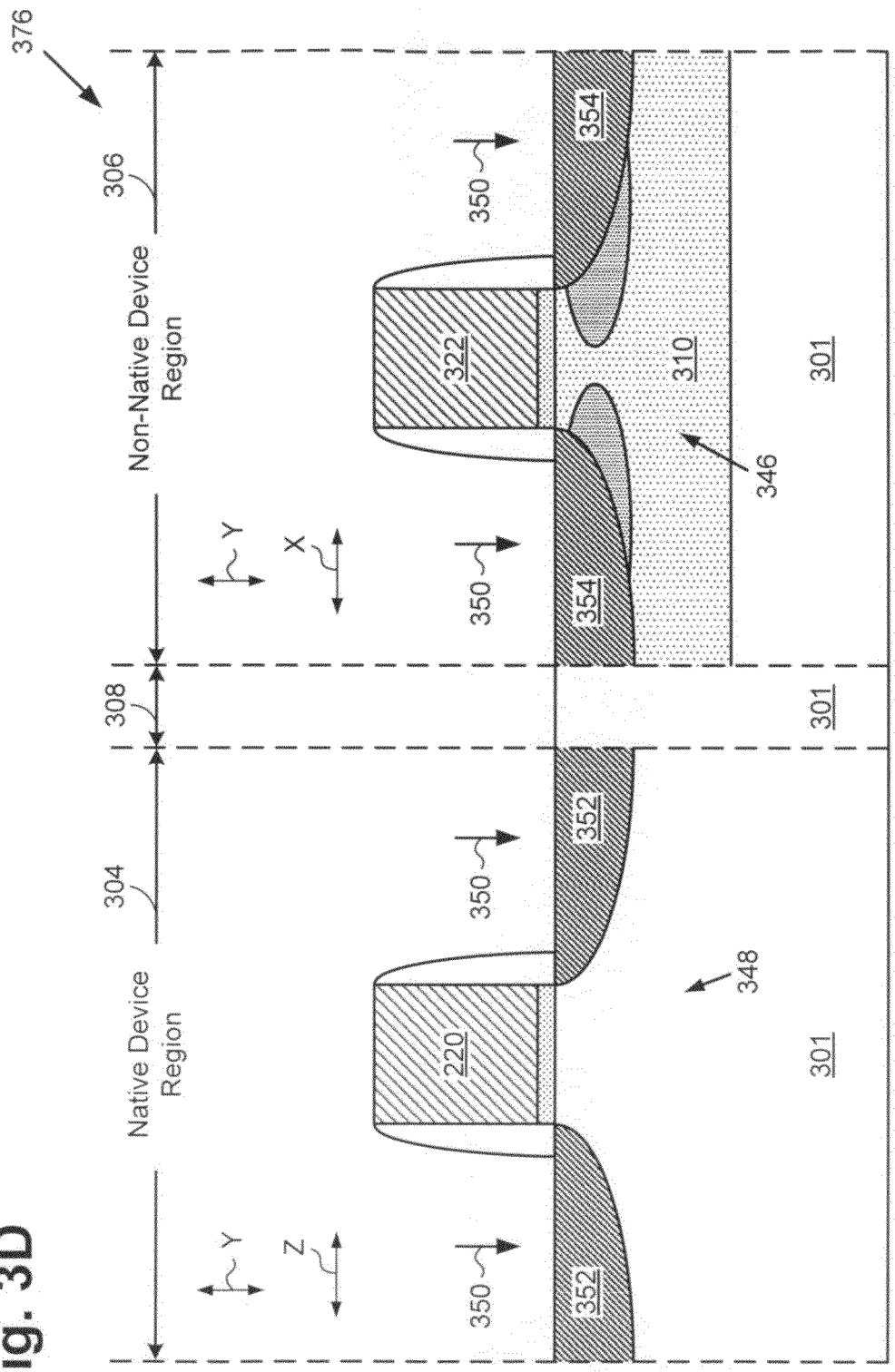
FIG. 3D shows a cross-sectional view, which includes a portion of a wafer processed according to an embodiment of the invention, corresponding to a final step in the flowchart in FIG. 2.

Referring now to step 276 in FIG. 2 and structure 376 in FIG. 3D, at step 276 of flowchart 200, respective native and non-native device regions 304 and 306 are exposed to impurities to form source/drain regions 352 in native device region 304, which can correspond to source/drain regions 152 in FIG. 1, and to form source/drain regions 354 in non-native device region 306, which can correspond to source/drain regions 154 in FIG. 1.

As shown in FIG. 3D, source/drain regions 352 and 354 can be formed by directing impurities along heading 350, which can comprise a Y component along Y-axis, through openings 330 and 332 in native device region 304 and through openings 334 and 336 in non-native device region 306. In one embodiment, source/drain regions 352 and 354 can comprise LDD regions. The result of step 276 of flowchart 200 is illustrated by structure 376 in FIG. 3D.

Additional process steps can be performed on structure 376 to form integrated native and non-native devices in respective native and non-native device regions 304 and 306. Thus, an integrated native device can be formed without halo implants formed in its channel region. As such, the native device can be formed with a threshold voltage near zero volts and without threshold voltage roll-up, which can cause threshold voltage to rise when the channel length is less than approximately 0.5 um, particularly in the range between approximately 0.05 um and approximately 0.3 um, where conventional native devices can have considerable voltage roll-up. Furthermore, an integrated non-native device can be formed with halo regions in its channel region, which can, for example, reduce short channel effects. Thus, an embodiment of the invention can provide integrated native and non-native devices with desirable performance characteristics, which can be maintained for short channel lengths.

Also, as discussed above, in one embodiment, a mask can comprise openings to form source/drain regions in both native and non-native device regions. Furthermore, the mask can form halo regions in the non-native device region. By exposing native and non-native device regions to impurities directed perpendicular to a non-native gate arrangement, the impurities can be blocked in the native device region while halo regions are formed through the mask openings in the non-native device region. As such, a single mask can be provided to form both source/drain regions and halo regions. Thus, an embodiment of the invention can provide integrated native and non-native devices in a highly integrated manufacturing process and at reduced cost.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. An integrated semiconductor structure comprising:
  an arrangement of semiconductor devices formed over a common substrate, said arrangement including
    native devices having respective channel regions of a first length and a first width shorter than the first length, the first length extending in a first direction, and
    non-native devices having respective channel regions of a second length and a second width shorter than the second length, the second length extending in a second direction substantially perpendicular to the first direction, the non-native devices having at least one halo region, said native devices not having halo regions and being separated from said non-native devices by an intervening region,
  wherein said arrangement prevents formation of halo implants in the channel regions of said native devices during halo implantation of said non-native devices.

2. The integrated semiconductor structure of claim 1, wherein each of said non-native devices includes a well region in which a channel region thereof and said at least one halo region formed.

3. The integrated semiconductor structure of claim 2, wherein said common substrate, said well region, and said at least one halo region are of a first conductivity type.

4. The integrated semiconductor structure of claim 3, wherein said first conductivity type is P type.

5. The integrated semiconductor structure of claim 1, wherein each of said channel regions of said native devices comprises a channel length of less than 0.5 micrometers.

6. The integrated semiconductor structure of claim 5, wherein said channel length is between 0.05 micrometers and 0.3 micrometers.

7. An integrated semiconductor structure comprising:
  an arrangement of semiconductor devices formed over a common substrate, said arrangement including native devices and non-native devices, wherein each of said non-native devices includes a well region, a channel region and at least one halo region formed in said well region, and wherein said native devices do not have halo regions and are separated from said non-native devices by an intervening region, wherein
    respective channel regions of the non-native devices having a first length and a first width shorter than the first length, the first length extending in a first direction, and respective channel regions of the native devices having a second length and a second width shorter than the second length, the second length extending in a second direction perpendicular to the first direction to prevent formation of halo implants in channel regions of said native devices during halo implantation of said non-native devices.

8. The integrated semiconductor structure of claim 7, wherein said common substrate, said well region, and said at least one halo region are of a first conductivity type.

9. The integrated semiconductor structure of claim 8, wherein said first conductivity type is P type.

10. The integrated semiconductor structure of claim 7, wherein each of said channel regions of said native devices comprises a channel length of less than 0.5 micrometers.

11. The integrated semiconductor structure of claim 10, wherein said channel length is between 0.05 micrometers and 0.3 micrometers.

12. An integrated semiconductor structure comprising:
  an arrangement of semiconductor devices formed over a common substrate, said arrangement including
    native devices having respective channel regions of a first length and a first width shorter than the first length, the first length extending in a first direction, and non-native devices having respective channel regions of a second length and a second width shorter than the second length, the second length extending in a second direction that is substantially perpendicular to the first direction, each of said non-native devices including a respective one of the channel regions and at least one halo region, said native devices not having halo regions and being separated from said non-native devices by an intervening region, wherein said arrangement prevents formation of halo implants in channel regions of said native devices during halo implantation of said non-native devices.

13. The integrated semiconductor structure of claim 12, wherein said common substrate and said at least one halo region are of a first conductivity type.

14. The integrated semiconductor structure of claim 13, wherein said first conductivity type is P type.

15. The integrated semiconductor structure of claim 12, wherein each of said channel regions of said native devices comprises a channel length of less than 0.5 micrometers.

16. The integrated semiconductor structure of claim 15, wherein said channel length is between 0.05 micrometers and 0.3 micrometers.

\* \* \* \* \*